United States Patent
Jang et al.

(10) Patent No.: US 9,709,842 B2
(45) Date of Patent: Jul. 18, 2017

(54) MASK OF DISPLAY DEVICE AND DISPLAY DEVICE FABRICATED WITH THE MASK

(71) Applicant: SAMSUNG DISPLAY CO., LTD., Yongin-si, Gyeonggi-do (KR)

(72) Inventors: Changsoon Jang, Seoul (KR); Esu Kim, Seoul (KR); Heera Kim, Seoul (KR); Yiseop Shim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 28 days.

(21) Appl. No.: 14/859,019

(22) Filed: Sep. 18, 2015

(65) Prior Publication Data

US 2016/0282665 A1 Sep. 29, 2016

(30) Foreign Application Priority Data

Mar. 23, 2015 (KR) ........................ 10-2015-0040176

(51) Int. Cl.
*G02F 1/1335* (2006.01)
*H01L 21/77* (2017.01)
*G02F 1/1339* (2006.01)
*G02F 1/1362* (2006.01)

(52) U.S. Cl.
CPC ........ *G02F 1/133512* (2013.01); *H01L 21/77* (2013.01); *G02F 1/13394* (2013.01); *G02F 2001/13625* (2013.01)

(58) Field of Classification Search
CPC ........... G02F 1/13394; G02F 1/133512; G02F 1/133514; G02F 1/133509; G02F 1/1339; G02F 1/136286; G02F 1/1368; G02F 1/134309; G02F 1/136209; G02F 1/133345; G02F 1/136227; G02F 1/134363; G02F 1/1362; G02F 1/1333; G02F 1/134336; G02F 2001/13396; G02F 2001/13398; G02F 2001/134372; G02F 2001/13625; G02F 2001/134318; G02F 2201/52; G03F 1/50; G03F 7/0005; G03F 7/004
USPC ... 349/43, 106, 110, 42, 139, 138, 143, 155, 349/156, 141
See application file for complete search history.

(56) References Cited

U.S. PATENT DOCUMENTS

2012/0038867 A1* 2/2012 Kwon ............... G02F 1/133512
349/110

FOREIGN PATENT DOCUMENTS

| JP | 2009-58607 | 3/2009 |
|---|---|---|
| KR | 10-2007-0002421 | 1/2007 |
| KR | 10-2007-0036415 | 4/2007 |
| KR | 10-2008-0082086 | 9/2008 |

* cited by examiner

Primary Examiner — Thoi Duong
(74) Attorney, Agent, or Firm — Innovation Counsel LLP

(57) ABSTRACT

A mask of a display device for forming a light shielding unit, which includes a first column spacer, a second column spacer, a light shielding layer, and a first groove, is capable of reducing the number of tones therein, the mask including: a first portion corresponding to the first column spacer; a second portion having substantially a same light transmittance as that of the first portion and corresponding to the second column spacer; a third portion corresponding to the light shielding layer; a fourth portion corresponding to a pixel region; and a fifth portion disposed between the first portion and the third portion to correspond to the first groove and having a light transmittance substantially the same as that of the fourth portion.

20 Claims, 12 Drawing Sheets

MASK OF DISPLAY DEVICE AND DISPLAY DEVICE FABRICATED WITH THE MASK

CROSS-REFERENCE TO RELATED APPLICATION

This application claims priority to and the benefit of Korean Patent Application No. 10-2015-0040176, filed on Mar. 23, 2015, in the Korean Intellectual Property Office, the disclosure of which is incorporated herein in its entirety by reference.

BACKGROUND

1. Field

Embodiments of the present inventive concept relate to a mask of a display device capable of reducing the number of tones in the mask and to a display device fabricated using the mask.

2. Description of the Related Art

Display devices may include column spacers to maintain a cell gap thereof. The column spacers may include a main column spacer and a sub-column spacer, each having different heights.

In particular, the main column spacer and the sub-column spacer may be formed of the same material as that forming a light shielding unit. In other words, the light shielding unit may include the main column spacer and the sub-column spacer. The light shielding unit may also be referred to as a black matrix, and may have an aperture portion for defining a pixel region.

The light shielding unit may have portions each having different heights, the portions including a portion corresponding to the main column spacer, a portion corresponding to the sub-column spacer, a portion corresponding to the light shielding unit, and a portion corresponding to the pixel region, respectively. Accordingly, a conventional mask used to manufacture the light shielding unit may have a total of four portions having different light transmittances. In other words, the conventional mask for manufacturing the light shielding unit may have four tones in total.

Meanwhile, an increase in the number of tones may result in an increase in a manufacturing cost of the mask.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present inventive concept are directed to a mask of a display device capable of reducing the number of tones in the mask to bring about a lower manufacturing cost, and to a display device manufactured using the same.

According to an exemplary embodiment of the present inventive concept, a mask of a display device for forming a light shielding unit, which includes a first column spacer, a second column spacer, a light shielding layer, and a first groove, includes: a first portion corresponding to the first column spacer; a second portion having substantially a same light transmittance as that of the first portion and corresponding to the second column spacer; a third portion corresponding to the light shielding layer; a fourth portion corresponding to a pixel region; and a fifth portion disposed between the first portion and the third portion to correspond to the first groove and having a light transmittance substantially the same as that of the fourth portion.

The fifth portion may surround the first portion.

Light transmittances of the first through fifth portions may be defined as the following Mathematical Formula 1, $$T1=T2>T3>T4=T5 \qquad \text{<Mathematical Formula 1>}$$

In the Mathematical Formula 1, T1, T2, T3, T4 and T5 may denote the light transmittance of the first portion, the light transmittance of the second portion, the light transmittance of the third portion, the light transmittance of the fourth portion, and the light transmittance of the fifth portion, respectively.

Light transmittances of the first through fifth portions may be defined as the following Mathematical Formula 2, $$T1=T2<T3<T4=T5 \qquad \text{<Mathematical Formula 2>}$$

In the Mathematical Formula 2, T1, T2, T3, T4 and T5 may denote the light transmittance of the first portion, the light transmittance of the second portion, the light transmittance of the third portion, the light transmittance of the fourth portion, and the light transmittance of the fifth portion, respectively.

The mask of a display device may further have a light transmission control pattern formed in the fifth portion.

The light transmission control pattern may have a light transmittance substantially the same as that of the first portion.

The first portion may have a dimension greater than that of the second portion.

At least one of the first portion and the second portion may have one of a circular or polygonal shape.

The light shielding unit may further have a second groove, and the mask may further have a sixth portion disposed between the second portion and the third portion to correspond to the second groove and having a light transmittance substantially the same as that of the fourth portion.

The sixth portion may have a dimension different from that of the fifth portion.

The sixth portion may have a dimension less than that of the fifth portion.

The sixth portion may have a width in a range of about 0.5 μm to about 1.5 μm, and the fifth portion may have a width in a range of about 2 μm to about 3 μm.

The first portion and the second portion have the same light transmittance of about 0% or 100%; the fourth portion and the fifth portion have the same light transmittance of about 0% or 100%; the first portion has a different light transmittance from the fourth portion.

The third portion may have a light transmittance of from about 45% to about 55%.

According to an exemplary embodiment of the present inventive concept, a display device includes: a first substrate and a second substrate opposed to each other; a liquid crystal layer disposed between the first substrate and the second substrate; a gate line and a data line disposed on the first substrate; a transistor connected to the gate line and the data line; a pixel electrode connected to the transistor and disposed in a pixel region; and a light shielding unit configured to define the pixel region. The light shielding unit may include: a light shielding layer defining the pixel region; a first column spacer; a second column spacer having a height less than that of the first column spacer; and a first groove surrounding the first column spacer.

The light shielding unit may further have a second groove surrounding the second column spacer.

The second groove may have a width less than that of the first groove.

The second groove may have a depth less than that of the first groove.

The light shielding unit may be disposed on one of the first substrate and the second substrate.

According to embodiments of the present inventive concept, a mask of a display device according to the present inventive concept may have the following effects.

The mask of a display device according to the present inventive concept may have a first portion corresponding to a first column spacer, a second portion corresponding to a second column spacer, a third portion corresponding to a light shielding layer, a fourth portion corresponding to a pixel region, and a fifth portion surrounding the first portion. Herein, the first portion may have a same light transmittance as a light transmittance of the second portion; and the fourth portion may have a same light transmittance as a light transmittance of the fifth portion. In addition, the first column spacer and the second column spacer may each have different heights due to the fifth portion. Accordingly, despite using a mask having a total of three tones, the light shielding unit may have portions each having different heights, the portions including a portion corresponding to the main column spacer, a portion corresponding to the sub-column spacer, a portion corresponding to the light shielding unit, and a portion corresponding to the pixel region, respectively.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of inventive concept will be more clearly understood from the following detailed description taken in conjunction with the accompanying drawings, in which.

DETAILED DESCRIPTION

Figure 1:
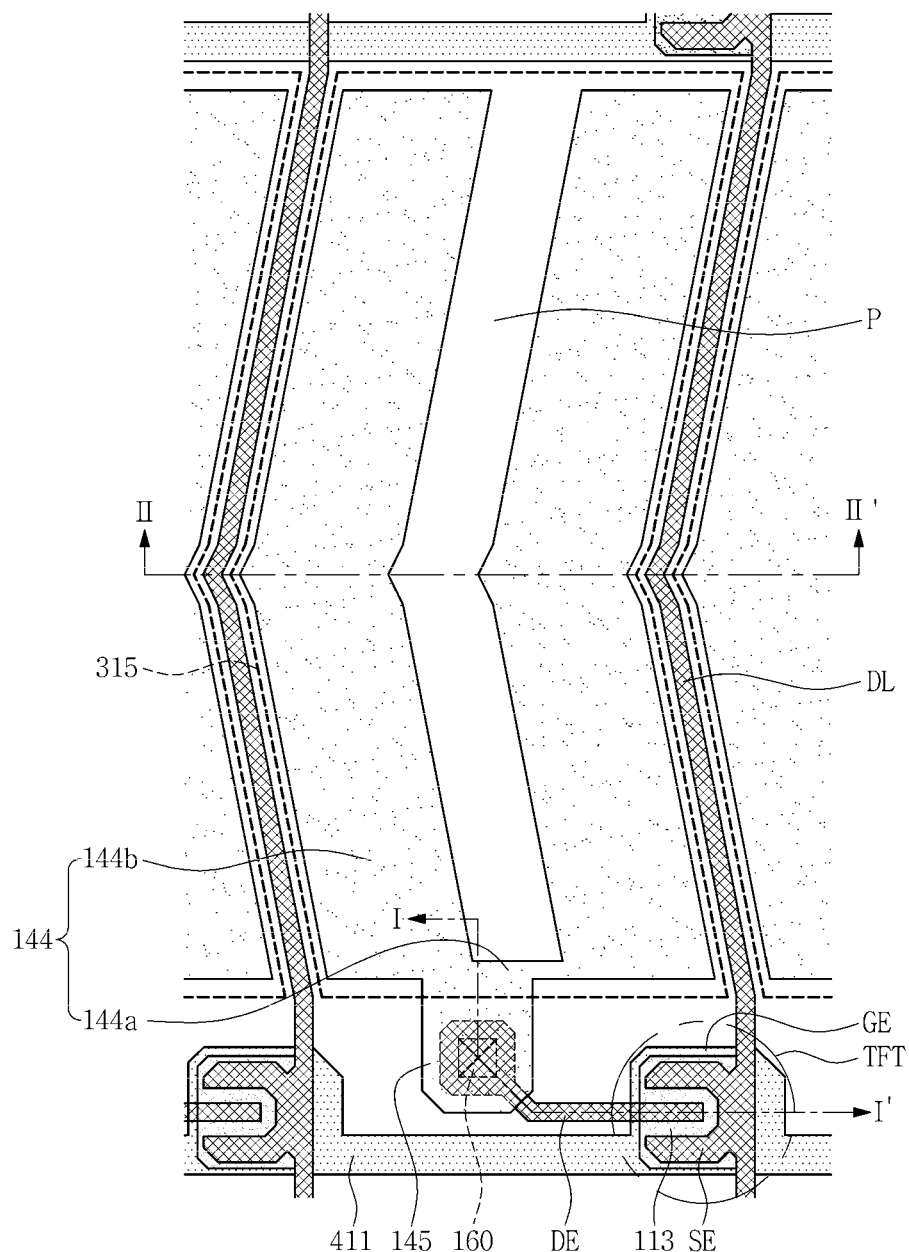
FIG. 1 is a plan view illustrating a pixel according to an exemplary embodiment.

Advantages and features of the present inventive concept and methods for achieving them will be made clear from embodiments described below in detail with reference to the accompanying drawings. The present inventive concept may, however, be embodied in many different forms and should not be construed as being limited to the embodiments set forth herein. Rather, these embodiments are provided so that this disclosure will be thorough and complete, and will fully convey the scope of the inventive concept to those skilled in the art. The present inventive concept is merely defined by the scope of the claims. Therefore, well-known constituent elements, operations and techniques are not described in detail in the embodiments in order to prevent the present inventive concept from being obscurely interpreted. Like reference numerals refer to like elements throughout the specification.

In the drawings, thicknesses are illustrated in an enlarged manner in order to clearly describe a plurality of layers and areas. Like reference numbers are used to denote like elements throughout the specification. When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in a case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
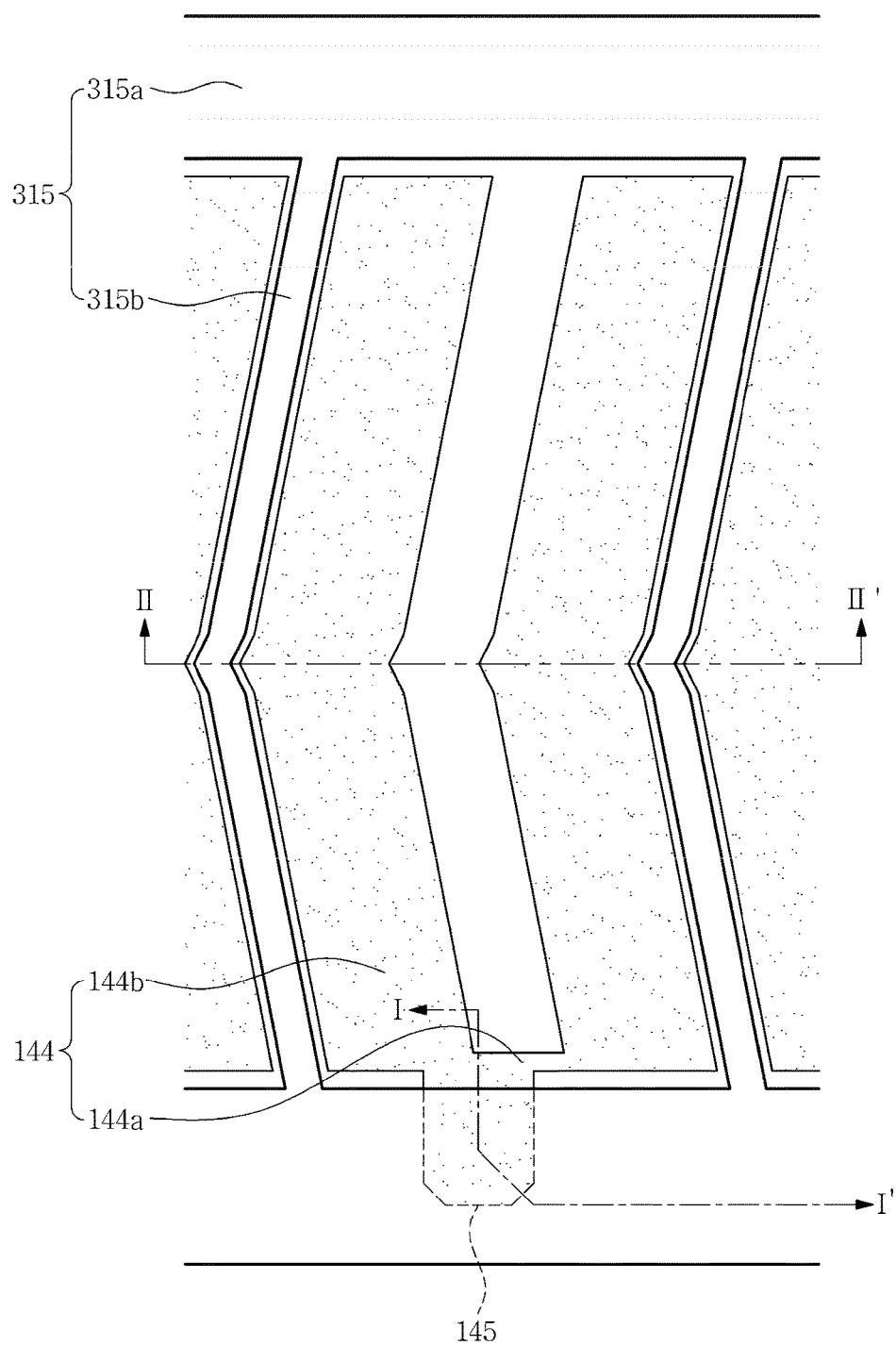
FIG. 2 is a plan view separately illustrating a light shielding unit and a pixel electrode of FIG. 1.
Figure 3:
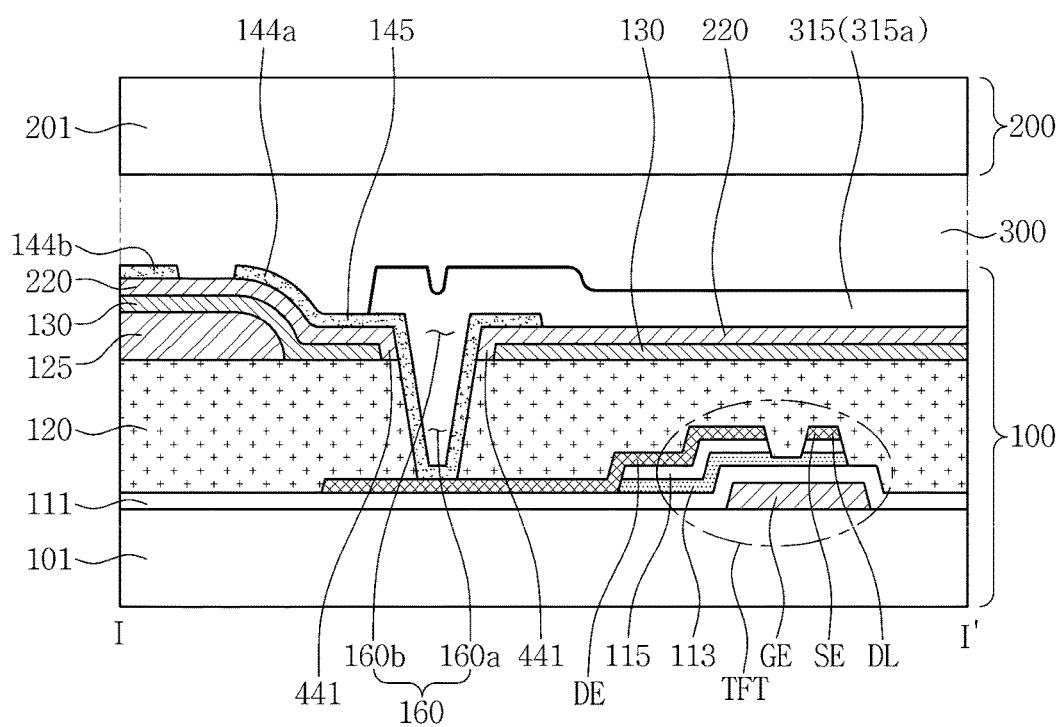
FIG. 3 is a cross-sectional view taken along line IT of FIGS. 1 and 2.
Figure 4:
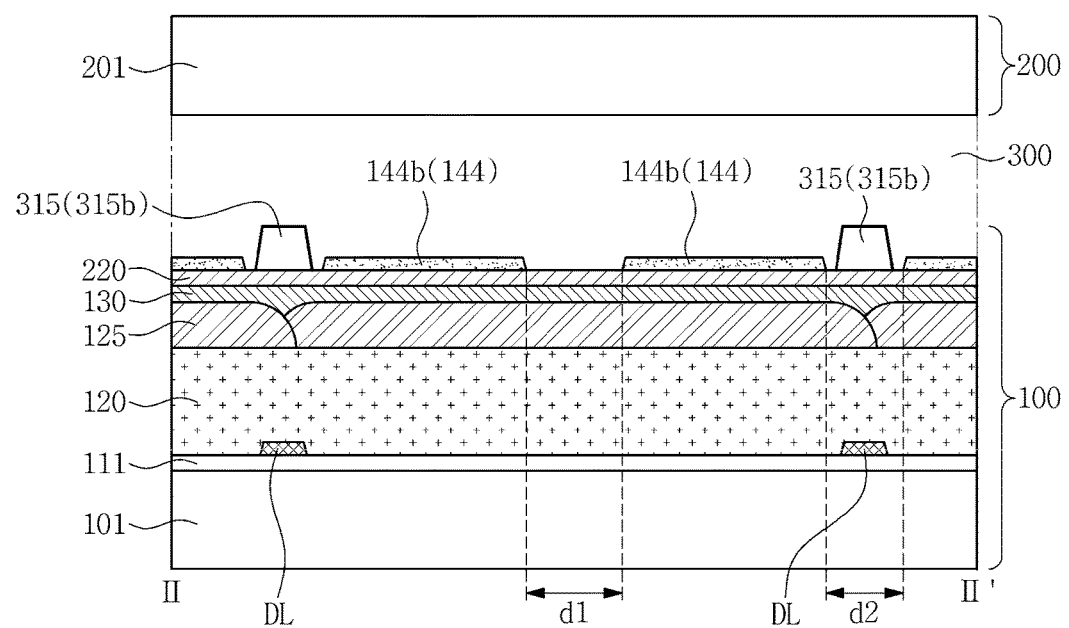
FIG. 4 is a cross-sectional view taken along line II-IF of FIG. 1.

FIG. 1 is a plan view illustrating a pixel according to an exemplary embodiment; FIG. 2 is a plan view separately illustrating a light shielding unit and a pixel electrode of FIG. 1; FIG. 3 is a cross-sectional view taken along line IT of FIGS. 1 and 2; and FIG. 4 is a cross-sectional view taken along line II-IF of FIG. 1;

Referring to FIGS. 3 and 4, a liquid crystal display (LCD) device according to the exemplary embodiment may include a lower panel 100 and an upper panel 200 opposed to each other and a liquid crystal layer 300 interposed therebetween.

Firstly, the lower panel 100 will be described hereinbelow.

The lower panel 100, as illustrated in FIGS. 1 through 4, may include a lower substrate 101, a gate line GL, a gate insulating layer 111, a semiconductor layer 113, an ohmic contact layer 115, a source electrode SE, a drain electrode DE, a thin film transistor ("TFT"), a data line DL, a first protection layer 120, a color filter 125, a common electrode 130, a second protection layer 220, a pixel electrode 144, and a light shielding unit 315.

The lower substrate 101 may include an insulating substrate including transparent materials, such as glass or plastics.

As illustrated in FIG. 1, the gate line GL is disposed on the lower substrate 101. The gate line GL may include a line portion 411 and an electrode portion GE (hereinafter, "gate electrode"), each having different widths. For example, the gate electrode GE may have a width greater than that of the line portion 411. The line portion 411 and the gate electrode GE may be integrally formed.

Although not illustrated, the gate line GL may have a connecting portion (e.g., an end portion), and the connecting portion may be greater than other portions thereof in size, so as to be properly connected to another layer or external driving circuits.

The gate line GL may include at least one metal of aluminum (Al) or alloys thereof, silver (Ag) or alloys thereof, copper (Cu) or alloys thereof, and/or molybdenum (Mo) or alloys thereof. Further, the gate line GL may include one of chromium (Cr), tantalum (Ta), and titanium (Ti). In some embodiments, the gate line GL may have a multi-layer structure including at least two conductive layers that have different physical properties.

The gate insulating layer 111 is disposed on the gate line GL. In this case, the gate insulating layer 111 may be formed over an entire surface of the lower substrate 101 including the gate line GL. The gate insulating layer 111 may be formed of, for example, silicon nitride ($SiN_x$), silicon oxide ($SiO_x$), and the like. The gate insulating layer 111 may have a multi-layer structure including at least two insulating layers that have physical properties different from each other.

The semiconductor layer 113 is disposed on the gate insulating layer 111. In this case, the semiconductor layer 113 may at least partially overlap the gate electrode GE. The semiconductor layer 113 may be made of amorphous silicon, polycrystalline silicon, oxide, or the like.

The ohmic contact layer 115 is disposed on the semiconductor layer 113. The ohmic contact layer 115 may include silicide or n+ hydrogenated amorphous silicon doped with n-type impurities, such as phosphorus, at high concentration. The ohmic contact layer 115 may be disposed on the semiconductor layer 113 in pairs.

The source electrode SE and the drain electrode DE are disposed on the ohmic contact layer 115.

The source electrode SE may branch off from the data line DL and as illustrated in FIG. 1, may have a shape protruding toward the gate electrode GE. The source electrode SE may have an inverted C-shape enclosing a part of the drain electrode DE. The source electrode SE may at least partially overlap the semiconductor layer 113 and the gate electrode GE. In some embodiments, the source electrode SE may have one of a C-shape, a U-shape, and an inverted U-shape, in lieu of the inverted C-shape.

In particular, the source electrode SE may be made of refractory metal, such as Mo, Cr, Ta, and Ti, or a metal alloy thereof, and may have a multi-layer structure including a refractory metal layer and a low-resistance conductive layer. Examples of the multi-layer structure may include: a double-layer structure including a Cr or Mo (alloy) lower film and an Al (alloy) upper film; and a triple-layer structure including a Mo (alloy) lower film, an Al (alloy) intermediate film, and a Mo (alloy) upper film. In some embodiments, the source electrode SE may be formed of various metals or conductive materials other than the aforementioned materials.

One side of the drain electrode DE may be connected to the pixel electrode 144 through a connection electrode 145. One side of the drain electrode DE may overlap the connection electrode 145, and another side of the drain electrode DE may overlap the semiconductor layer 113 and the gate electrode GE.

The drain electrode DE may also include the same material and have the same structure (a multi-layer structure) as those of the source electrode SE. In other words, the drain electrode DE and the source electrode SE may be simultaneously formed in the same process.

The gate electrode SE, the source electrode SE, and the drain electrode DE may together form a TFT, along with the semiconductor layer 113. In this case, a channel of the TFT may be formed on a portion of the semiconductor layer 113 between the source and drain electrodes SE and DE. The portion of the semiconductor layer 113 corresponding to the channel may have a thickness less than that of other portions of the semiconductor layer 113.

The data line DL is configured to transmit an image data signal. The data line DL is formed on the gate insulating layer 111. Although not illustrated, the data line DL may have a connecting portion (e.g., an end portion), and the connecting portion may be greater than other portions thereof in size, so as to be properly connected to another layer or external driving circuits.

The data line DL may intersect the gate line GL. The data line DL may be provided in a zigzag shape. In this case, in order to achieve a greater transmittance of the LCD device, a protrusion portion having a wedge shape may be disposed at a bent portion of the data line DL. Herein, the data line DL may be divided into a protrusion portion and line portions respectively disposed at both sides of the protrusion portion. A contained angle of the protrusion portion may be less than a contained angle between the line portions.

The data line DL may include the same material and may have the same structure (a multi-layer structure) as those of the source electrode SE. In other words, the data line DL and the source electrode SE may be simultaneously formed in the same process.

The first protection layer 120 is disposed on the data line DL, the source electrode SE, and the drain electrode DE. In this case, the first protection layer 120 may be formed over an entire surface of the lower substrate 101 including the data line DL, the source electrode SE, and the drain electrode DE.

The first protection layer 120 may be formed of, for example, inorganic insulating materials such as silicon nitride ($SiN_x$) and silicon oxide ($SiO_x$). The first protection layer 120 may be formed of an organic insulating material. When the first protection layer 120 is made of an organic insulating material, an organic insulating material having photosensitivity and having a dielectric constant of about 4.0 may be used. The first protection layer 120 may also have a double-layer structure including a lower inorganic layer and an upper organic layer, which has been found to impart desirable insulating properties and also to prevent damage to exposed portions of the semiconductor layer 113. As examples, the first protection layer 120 may have a thickness of greater than or equal to about 5000 angstroms (Å), for example, in a range of about 6000 Å to about 8000 Å.

The first protection layer 120 may have a lower contact hole 160a extending partially therethrough, and the drain electrode DE may be partially exposed through the lower contact hole 160a.

The color filter 125 is disposed on the first protection layer 120. For example, the color filter 125 may be disposed on the first protection layer 120 corresponding to the pixel region P of the lower substrate 101. The color filters 125 may include a red color filter, a green color filter, and a blue color filter. For example, referring to FIG. 4, a color filter disposed at a leftmost portion may be a red color filter, a color filter disposed at a rightmost portion may be a blue color filter, and a color filter disposed in the center may be a green color filter.

The common electrode 130 is disposed on the first protection layer 120 and on the color filter 125. In this case, the common electrode 130 may be formed over an entire surface of the lower substrate 101 including the first protection layer 120 and the color filter 125. However, as illustrated in FIG. 3, the common electrode 130 may have an aperture extending partially therethrough, and the aperture may be disposed directly above the lower contact hole 160a. The aperture may have a sufficiently large size to surround the lower contact hole 160a and an upper contact hole 160b to be described below. The drain electrode DE may be partially exposed through the aperture and the lower contact hole 160a.

The common electrode 130 may include transparent conductive materials such as indium tin oxide ("ITO") or indium zinc oxide ("IZO"). In this case, ITO may be a polycrystalline or monocrystalline material, and IZO may be an amorphous material, as well. Meanwhile, the common electrode 130 may include materials the same as those forming the gate line GL or the data line DL.

A second protection layer 220 is disposed on the common electrode 130. That is, the second protection layer 220 may be formed over an entire surface of the lower substrate 101 including the common electrode 130.

The second protection layer 220 may include a material forming the first protection layer 120.

The second protection layer 220 may have an upper contact hole 160b extending partially therethrough, and the upper contact hole 160b may be disposed directly above the aforementioned aperture. The lower contact hole 160a and the upper contact hole 160b may be connected to each other through the aperture, thereby forming a single drain contact hole 160.

Meanwhile, the drain contact hole 160 may be formed in the following method. That is, subsequent to the common electrode 130 being formed on the first protection layer 120, a portion of the common electrode 130 may be removed through a photolithography process and an etching process, thereby forming an aperture. The first protection layer 120 may be exposed through the aperture. Subsequently, the second protection layer 220 may be formed over an entire surface of the lower substrate 101 including the common electrode 130 having the aperture formed thereon. In this case, a portion of the second protection layer 220 may be brought into contact with a portion of the first protection layer 120 exposed through the aperture. The portion of the second protection layer 220 and the portion of the first protection layer 120, which are disposed within the aperture, may be removed all at once through a photolithography process and an etching process, thereby forming the drain contact hole 160. In this case, the drain contact hole 160 needs to be much smaller than the aperture. When the drain contact hole 160 is much smaller than the aperture, an exposed surface of the common electrode 130, which corresponds to an inner wall of the aperture, may be sufficiently covered by the second protection layer 220; this is to prevent a short circuit between the common electrode 130 and the pixel electrode 144 to be subsequently formed to contact the drain contact hole 160.

The pixel electrode 144 may generate an electric field along with the common electrode 130. The pixel electrode 144 is disposed on the second protection layer 220. In detail, the pixel electrode 144 may be disposed on the second protection layer 220 corresponding to the pixel region P of the lower substrate 101.

The pixel electrode 144 may include a stem electrode 144a and a plurality of branch electrodes 144b branching off from the stem electrode 144a. The plurality of branch electrodes 144b may be spaced a predetermined distance apart from each other. The stem electrode 144a and the branch electrodes 144b may overlap the common electrode 130.

An electric field may be generated between the branch electrodes 144b, which are linear electrodes, and the common electrode 130, which is a plate electrode. The branch electrodes 144b may each extend in a direction substantially the same as a direction of the data line DL. The branch electrodes 144b may each have a shape the same as that of a portion of the data line DL.

Further, the branch electrodes 144b may each have a protrusion portion having a wedge shape. The protrusion portion of each of the branch electrodes 144b may have a shape substantially the same as that of the protrusion portion of the data line DL.

Meanwhile, the branch electrodes 144b may further extend outside of the pixel region P.

The pixel electrode 144 may include transparent conductive materials such as ITO or IZO. In this case, ITO may be a polycrystalline or monocrystalline material, and IZO may be an amorphous material.

The connection electrode 145 may be connected between the pixel electrode 144 and the TFT. The connection electrode 145 may be integrally formed with the pixel electrode 144. The connection electrode 145 may extend from the stem electrode 144a of the pixel electrode 144 onto the drain electrode DE of the TFT. The connection electrode 145 may be connected to the drain electrode DE through the drain contact hole 160.

The connection electrode 145 may include materials the same as those forming the pixel electrode 144. The connection electrode 145 and the pixel electrode 144 may be integrally formed.

Meanwhile, as illustrated in FIG. 3, a portion 441 of the second protection layer 220 is disposed between the pixel electrode 144 and the exposed surface of the common electrode 130, which corresponds to the inner wall of the aperture, such that a short circuit between the pixel electrode 144 and the common electrode 130 may be prevented.

The light shielding unit 315 may block light from pass through an area other than the pixel region P. In other words, the light shielding unit 315 may prevent light leakage in a non-pixel region. To this end, the light shielding unit 315 may have an aperture exposing the pixel region P, and may cover an entire area except the pixel region P. Thus, the pixel region P may be defined by the light shielding unit 315.

The light shielding unit 315 may have a dielectric constant in a range of about 3 to about 5.

The light shielding unit 315 will be described further with reference to FIG. 2.

The light shielding unit 315, as illustrated in FIG. 2, may include a horizontal portion 315a and a vertical portion 315b. Meanwhile, although not illustrated in FIG. 2, the light shielding portion 315 may further include a first column spacer 501 (refer to FIG. 5) and a second column spacer 502 (refer to FIG. 5), which will be describe further hereinbelow.

The horizontal portion 315a may extend along the gate line GL. The horizontal portion 315a may overlap the gate line GL, the TFT, the connection electrode 145, and the data line DL. In this case, the gate electrode GE, the source electrode SE, and the drain electrode DE of the TFT may overlap the horizontal portion 315a.

The vertical portion 315b may be disposed between adjacent horizontal portions 315a, and may extend along the data line DL. The vertical portion 315b may overlap the data line DL.

Meanwhile, although not illustrated, the vertical portion 315b of the light shielding unit 315 may be in contact with the pixel electrode 144. For example, the vertical portion 315b may be in contact with an upper surface of the pixel electrode 144. Herein, the upper surface of the pixel electrode 144 refers to an upper surface of the branch electrode 144b. The upper surface of the branch electrode 144b may be disposed toward the liquid crystal layer 300. The vertical portion 315b may be in contact with an edge portion of the upper surface of the branch electrode 144b.

As illustrated in FIG. 4, a distance d1 between adjacent branch electrodes 144b provided in a single pixel electrode 144 may be greater than a distance d2 between the branch electrode 144b of the pixel electrode 144 and a branch electrode of another pixel electrode. Herein, the pixel electrode 144 and the another pixel electrode may be disposed adjacent to each other while having the data line DL interposed therebetween in a plan view.

Meanwhile, although not illustrated, a lower alignment layer may be disposed on the pixel electrode 144, the connection electrode 145, the second protection layer 220, and the light shielding unit 315. The lower alignment layer may be a homeotropic alignment layer, and may be an alignment layer including photoreactive materials.

The lower alignment layer may include at least one of polyamic acid, polysiloxane, and polyimide.

The upper panel 200 may include an upper substrate 201. The upper substrate 201 may be an insulating substrate including transparent materials, such as glass or plastics.

Meanwhile, although not illustrated, the upper panel 200 may further include an upper alignment layer. The upper alignment layer may be disposed on the upper substrate.

The upper alignment layer may include a material the same as that forming the lower alignment layer.

When surfaces of the lower substrate 101 and the upper substrate 102 that face each other are respectively defined as upper surfaces of the corresponding substrate, and surfaces opposite to the upper surfaces are respectively defined as lower surfaces of the corresponding substrate, an upper polarizer may further be disposed on the lower surface of the lower substrate 101, and a lower polarizer may further be disposed on the lower surface of the upper substrate 201.

A transmission axis of the upper polarizer may be perpendicular to a transmission axis of the lower polarizer, and thus one of the transmission axes thereof and the line portion 411 of the gate line GL may be disposed in parallel with each other. Meanwhile, the display device may only include one of the upper polarizer and the lower polarizer.

Meanwhile, the color filter 125 may be disposed on the upper panel 200 rather than on the lower panel 100. In this case, the color filter 125 may be disposed in a pixel region of the upper substrate 201.

Figure 5:
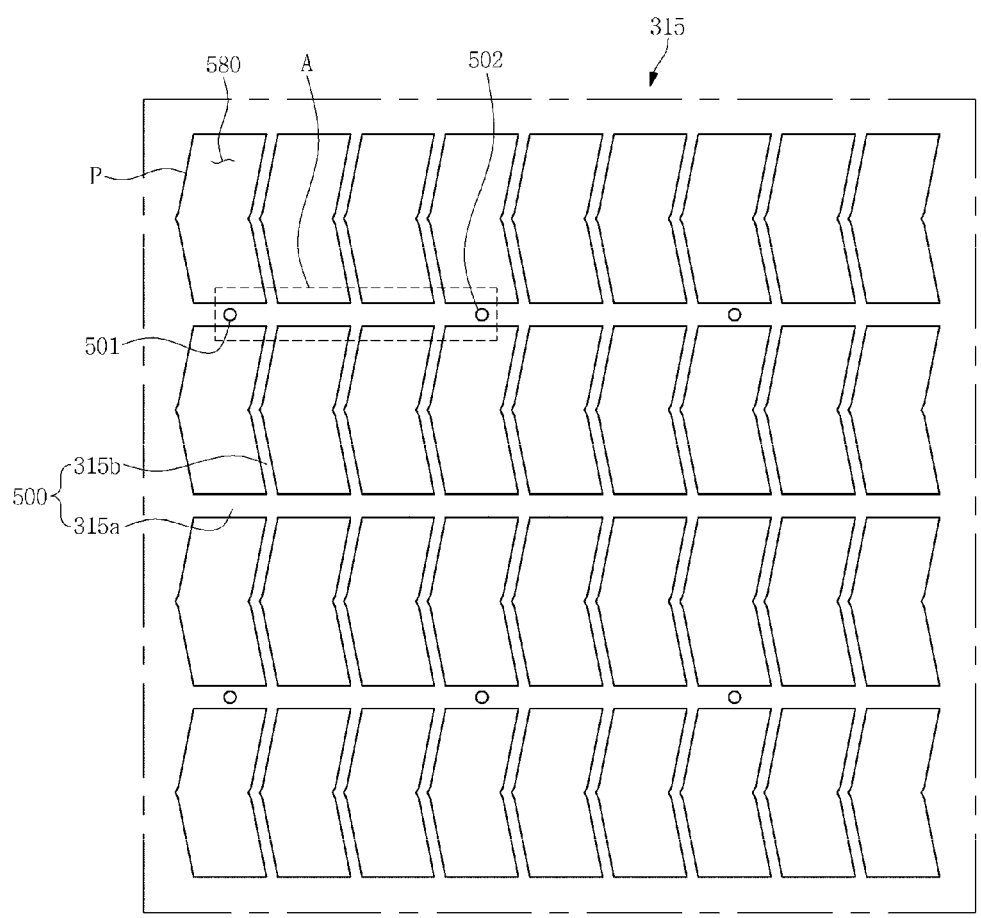
FIG. 5 is a plan view illustrating a light shielding unit for defining a plurality of pixel regions including the pixel region of FIG. 1.

FIG. 5 is a plan view illustrating the light shielding unit 315 defining a plurality of pixel regions P including the pixel region P of FIG. 1.

The light shielding unit 315, as illustrated in FIG. 5, may include a light shielding layer 500, a first column spacer 501, a second column spacer 502, and a groove (not illustrated). Herein, the light shielding layer 500 may include the aforementioned horizontal portion 315a and the vertical portion 315b. The light shielding layer 500 may have aperture portions 580 for defining the pixel regions P.

The light shielding layer 500, the first column spacer 501, and the second column spacer 502 may be integrally formed.

The first and second column spacers 501 and 502, as illustrated in FIG. 5, may be disposed on the gate line GL. In another exemplary embodiment, the first and second column spacers 501 and 502 may be disposed on the data line DL, rather than on the gate line GL. In yet another exemplary embodiment, one of the first and second column spacers 501 and 502 may be disposed on the gate line GL, and the other thereof may be disposed on the data line DL.

Figure 6:
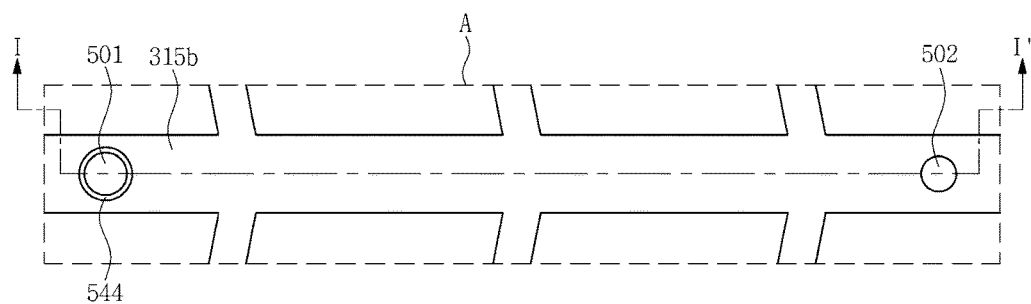
FIG. 6 is an enlarged plan view illustrating a portion A of FIG. 5.
Figure 7:
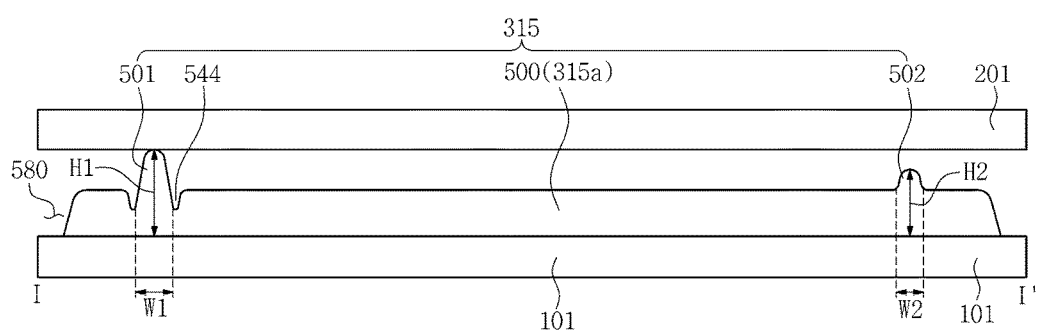
FIG. 7 is a cross-sectional view taken along line IT of FIG. 6.

FIG. 6 is an enlarged plan view illustrating a portion A of FIG. 5; and FIG. 7 is a cross-sectional view taken along line I-I' of FIG. 6.

As illustrated in FIG. 6, the first column spacer 501 and the second column spacer 502 may each have a circular shape. In another exemplary embodiment, the first and second column spacers 501 and 502 may each have a polygonal shape.

As illustrated in FIG. 7, the first column spacer 501 may have a height greater than that of the second column spacer 502. In other words, a height H1 of the first column spacer 501 may be greater than a height H2 of the second column spacer 502. In addition, the first column spacer 501 may have a width greater than that of the second column spacer 502. In other words, a width W1 of the first column spacer 501 may be greater than a width W2 of the second column spacer 502.

The first column spacer 501 may be in contact with the upper substrate 201. That is, an upper end portion of the first column spacer 501 and the upper substrate 201 may be in contact with each other. On the contrary, the second column spacer 502 may not be in contact with the upper substrate 201.

As illustrated in FIGS. 6 and 7, a groove 544 may be formed around the first column spacer 501. The groove 544 may surround the first column spacer 501. For example, the groove 544 may have a loop shape surrounding a peripheral portion of the first column spacer 501. The groove 554 may be recessed below a top surface of the light shielding layer 500.

Meanwhile, referring to FIG. 7, the light shielding unit 315 is disposed on the lower substrate 101. In this case, although not illustrated in FIG. 7, the aforementioned elements disposed between the light shielding unit 315 and the lower substrate 101 of FIGS. 3 and 4 may be disposed between the light shielding unit 315 and the lower substrate 101 of FIG. 7 in the same manner.

Figure 8:
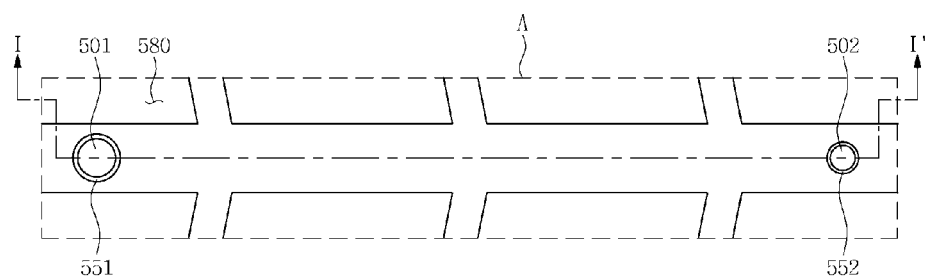
FIG. 8 is another enlarged plan view illustrating a portion A of FIG. 5.
Figure 9:
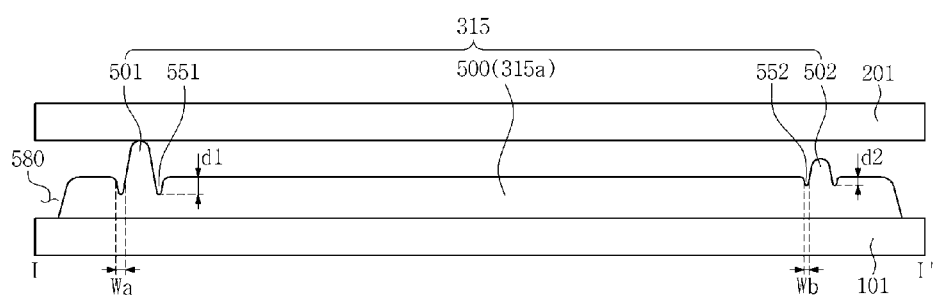
FIG. 9 is a cross-sectional view taken along line IT of FIG. 8.

FIG. 8 is another enlarged plan view illustrating a portion A of FIG. 5; and FIG. 9 is a cross-sectional view taken along line IT of FIG. 8.

As illustrated in FIG. 8, a first column spacer 501 and a second column spacer 502 may have a circular shape. In another exemplary embodiment, the first and second column spacers 501 and 502 may each have a polygonal shape.

As illustrated in FIG. 8, the first column spacer 501 may have a height greater than that of the second column spacer 502. In addition, the first column spacer 501 may have a width greater than that of the second column spacer 502.

The first column spacer 501 may be in contact with an upper substrate 201. That is, an upper end portion of the first column spacer 501 and the upper substrate 201 may be in contact with each other. On the contrary, the second column spacer 502 may not be in contact with the upper substrate 201.

As illustrated in FIGS. 8 and 9, a first groove 551 may be formed around the first column spacer 501. The first groove 551 may surround the first column spacer 501. For example, the first groove 551 may have a loop shape surrounding a peripheral portion of the first column spacer 501.

As illustrated in FIGS. 8 and 9, a second groove 552 may be formed around the second column spacer 502. The second groove 552 may surround the second column spacer 502. For example, the second groove 552 may have a loop shape surrounding a peripheral portion of the second column spacer 502.

The first groove 551 may have a width greater than that of the second groove 552. In other words, a width Wa of the first groove 551 may be greater than a width Wb of the second groove 552. In addition, the first groove 551 may have a depth greater than that of the second groove 552. In other words, a depth d1 of the first groove 551 may be greater than a depth d2 of the second groove 552. The first groove 551 and the second groove 552 may be recessed below a top surface of the light shielding unit 315.

Meanwhile, referring to FIG. 9, a light shielding unit 315 is disposed on the lower substrate 101. In this case, although not illustrated in FIG. 9, the aforementioned elements disposed between the light shielding unit 315 and the lower substrate 101 of FIGS. 3 and 4 may be disposed between the light shielding unit 315 and a lower substrate 101 of FIG. 9 in the same manner.

Figure 10:
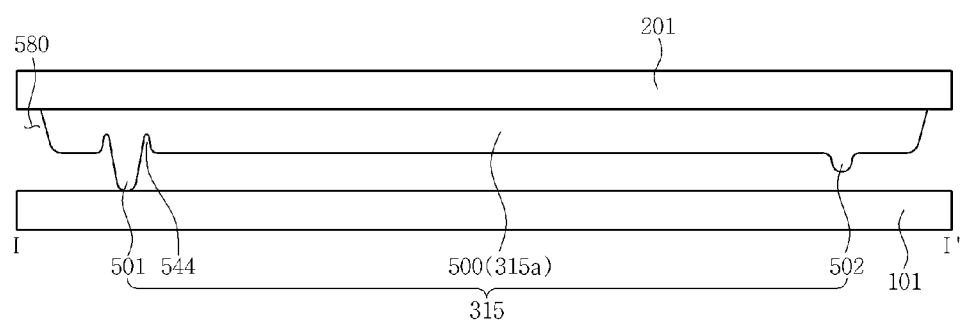
FIG. 10 is another cross-sectional view taken along line IT of FIG. 6.

FIG. 10 is another cross-sectional view taken along line IT of FIG. 6.

As illustrated in FIG. 10, the light shielding unit 315 including the light shielding layer 500, the first column spacer 501, the second column spacer 502, and the groove 544 may be disposed on the upper substrate 201.

The first column spacer 501 may be in contact with the lower substrate 101. That is, a lower end portion of the first column spacer 501 may be in contact with the second protection layer 220 or the connection electrode 145. On the contrary, the second column spacer 502 may not be in contact with the lower substrate 101.

Figure 11:
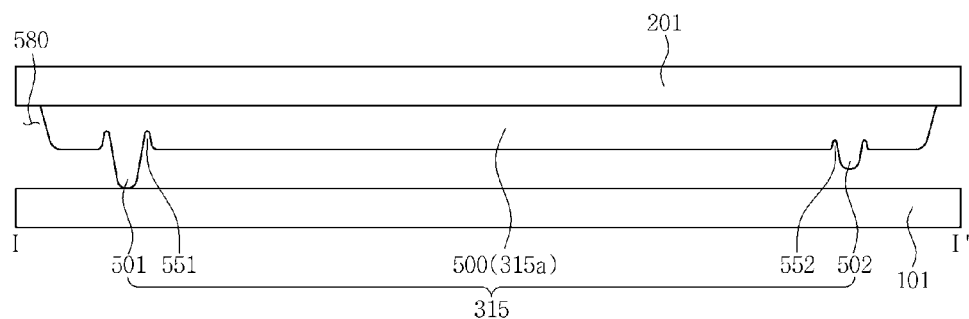
FIG. 11 is another cross-sectional view taken along line IT of FIG. 8.

FIG. 11 is another cross-sectional view taken along line IT of FIG. 8.

As illustrated in FIG. 11, a light shielding unit 315 including a light shielding layer 500, the first column spacer 501, the second column spacer 502, and the groove 544 may be disposed on the upper substrate 201.

The first column spacer 501 may be in contact with the lower substrate 101. That is, a lower end portion of the first column spacer 501 may be in contact with a second protection layer 220 or a connection electrode 145. On the contrary, the second column spacer 502 may not be in contact with the lower substrate 101.

Figure 12:
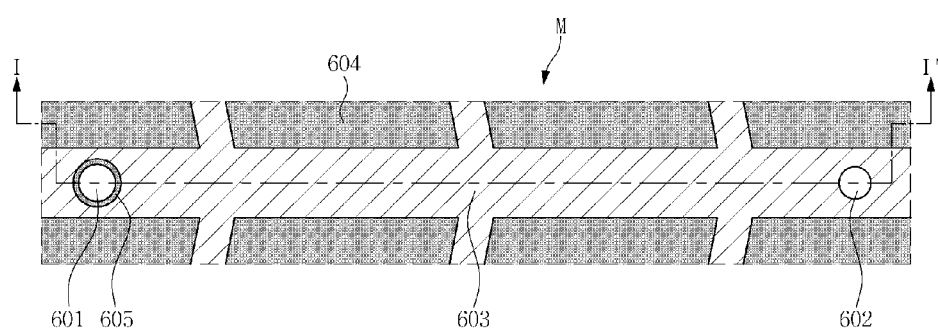
FIG. 12 is a plan view illustrating a portion of a mask used to form a light shielding unit illustrated in FIGS. 6 and 7.
Figure 13:
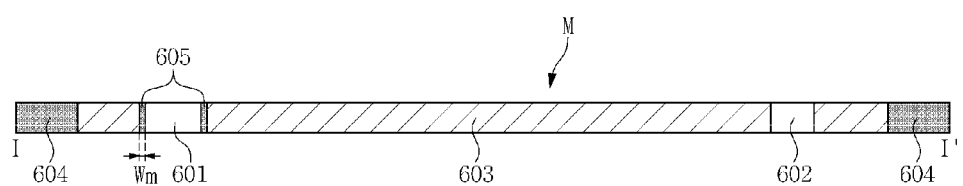
FIG. 13 is a cross-sectional view taken along line IT of FIG. 12.

FIG. 12 is a plan view illustrating a portion of a mask M used to form the light shielding unit 315 illustrated in FIGS. 6 and 7; and FIG. 13 is a cross-sectional view taken along line I-I' of FIG. 12.

The mask M, as illustrated in FIGS. 12 and 13, may include a first portion 601, a second portion 602, a third portion 603, a fourth portion 604, and a fifth portion 605.

The first portion 601 may correspond to the first column spacer 501 of the light shielding unit 315. That is, the first portion 601 may define the position of the first column spacer 501. The first portion 601 may have a circular shape.

The second portion 602 may correspond to the second column spacer 502. That is, the second portion 602 may define the position of the second column spacer 502. The second portion 602 may have a light transmittance substantially the same as that of the first portion 601. The second portion 602 may have a circular shape.

The third portion 603 may correspond to the light shielding layer 500. That is, the third portion 603 may define the position of the light shielding layer 500. The light shielding layer 500 may have a light transmittance different from the light transmittance of the first portion and the second portion 601 and 602.

The fourth portion 604 may correspond to the pixel region P. That is, the fourth portion 604 may define the position of the pixel region P. The fourth portion 604 may correspond to the aforementioned aperture portion 580 of the light shielding unit 315. The fourth portion 604 may have a light transmittance different from the light transmittances of the light shielding layer 500, the first portion 601, and the second portion 602.

The fifth portion 605 may correspond to the groove 544. That is, the fifth portion 605 may define the position of the groove 544. The fifth portion 605 may be disposed between the first portion 601 and the third portion 603. In other words, the fifth portion 605 may be disposed in a boundary area between the first portion 601 and the third portion 603. In this case, the fifth portion 605 may have a loop shape surrounding a peripheral portion of the first portion 601. The fifth portion 605 may have a light transmittance substantially the same as that of the fourth portion 604.

The light shielding unit 315 may be formed of a material including a negative-type photoresist, or may be formed of a material including a positive-type photoresist. The negative-type photoresist may be converted into an insoluble material upon being exposed to light, whereas the positive-type photoresist may be converted into a soluble material upon being exposed to light.

When the light shielding unit 315 is formed of the material including the negative-type photoresist, the light transmittances of the first through fifth portions 601, 602, 603, 604, and 605 of the aforementioned mask M may have a comparative relationship defined by the following Mathematical Formula 1.

$$T1=T2>T3>T4=T5 \qquad \text{<Mathematical Formula 1>}$$

In the above Mathematical Formula 1, T1, T2, T3, T4 and T5 denote the light transmittance of the first portion 601, the light transmittance of the second portion 602, the light transmittance of the third portion 603, the light transmittance of the fourth portion 604, and the light transmittance of the fifth portion 605, respectively.

For example, the first portion 601 and the second portion 602 may each have a light transmittance of about 100 percent (%); the third portion 603 may have a light transmittance of from about 45% to about 55%; and the fourth portion 604 and the fifth portion 605 may each have a light transmittance of about 0%.

The first portion 601 and the second portion 602 may have the greatest light transmittance of those of the first through fifth portions 601, 602, 603, 604, and 605. The light transmittance of the first portion 601 and the second portion 602 may be substantially 100%. Accordingly, the first column spacer 501 disposed corresponding to the first portion 601 and the second column spacer 502 disposed corresponding to the second portion 602 may have a relatively great height.

The first portion 601 may have a dimension equal to that of the second portion 602, but alternatively, they may have different dimensions. As illustrated in FIGS. 12 and 13, the first portion 601 may have a dimension greater than that of the second portion 602.

The height of the first column spacer 501 may vary depending on the size of the groove 544, and the size of the groove 544 may vary depending on the dimension of the fifth portion 605. Accordingly, the height of the first column spacer 501 may vary in accordance with the width of the fifth portion 605. In this case, as the width of the fifth portion 605 increases, the height of the first column spacer 501 may increase.

The first column spacer 501 surrounded by the groove 544 may have a height greater than that of the second column spacer 502.

The third portion 603 may have the second greatest light transmittance of those of the first through fifth portions 601, 602, 603, 604, and 605. Accordingly, the light shielding layer 500 disposed corresponding to the third portion 603 may have a height less than that of the second column spacer 502.

The fourth portion 604 may have the least height of those of the first through fifth portions 601, 602, 603, 604, and 605. The light transmittance of the fourth portion 604 may be substantially 0%. Accordingly, the aperture portion 580 may be defined in the fourth portion 604.

On the other hand, when the light shielding unit 315 is formed of a material including the positive-type photoresist, the light transmittance of the first through fifth portions 601, 602, 603, 604, and 605 of the aforementioned mask M may have a comparative relationship defined by the following Mathematical Formula 2.

$$T1=T2<T3<T4=T5 \qquad \text{<Mathematical Formula 2>}$$

In the above Mathematical Formula 2, T1, T2, T3, T4 and T5 denote the light transmittance of the first portion 601, the light transmittance of the second portion 602, the light transmittance of the third portion 603, the light transmittance of the fourth portion 604, and the light transmittance of the fifth portion 605, respectively. For example, the first portion 601 and the second portion 602 may each have a light transmittance of about 0 percent (%); the third portion 603 may have a light transmittance of from about 45% to about 55%; and the fourth portion 604 and the fifth portion 605 may each have a light transmittance of about 100%.

Figure 14:
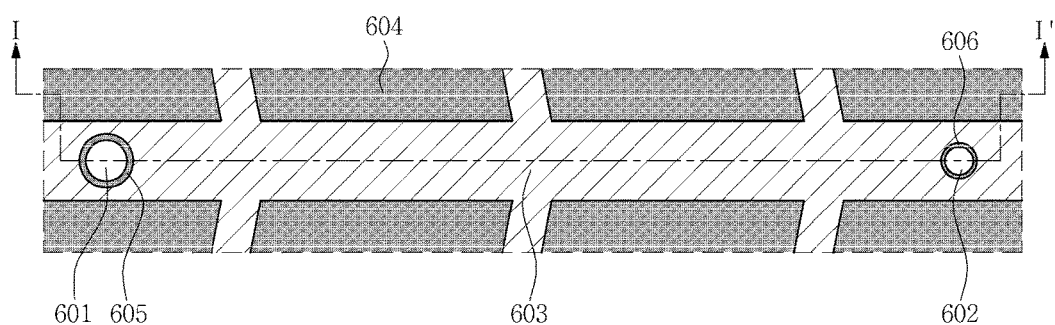
FIG. 14 is a plan view illustrating a portion of a mask used to form the light shielding unit illustrated in FIGS. 8 and 9.
Figure 15:
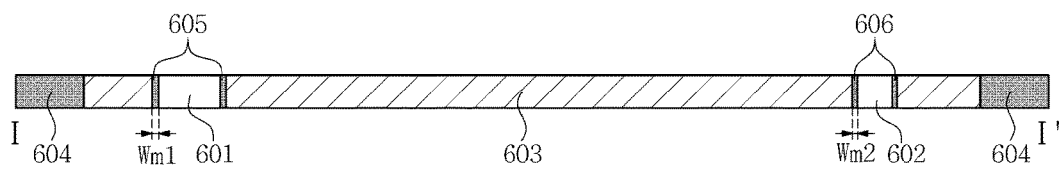
FIG. 15 is a cross-sectional view taken along line IT of FIG. 14.

FIG. 14 is a plan view illustrating a portion of a mask M used to form the light shielding unit 315 illustrated in FIGS. 8 and 9; and FIG. 15 is a cross-sectional view taken along line I-I' of FIG. 14.

The mask M, as illustrated in FIGS. 14 and 15, may include a first portion 601, a second portion 602, a third portion 603, a fourth portion 604, and a fifth portion 605.

The first portion 601 may correspond to the first column spacer 501 of the light shielding unit 315. That is, the first portion 601 may define the position of the first column spacer 501. The first portion 601 may have a circular shape.

The second portion 602 may correspond to the second column spacer 502. That is, the second portion 602 may define the position of the second column spacer 502. The second portion 602 may have a light transmittance substantially the same as that of the first portion 601. The second portion 602 may have a circular shape.

The third portion 603 may correspond to the light shielding layer 500. That is, the third portion 603 may define the position of the light shielding layer 500. The third portion 603 may have a light transmittance different from the light transmittance of the first portion and the second portion 601 and 602.

The fourth portion 604 may correspond to the pixel region P. That is, the fourth portion 604 may define the position of the pixel region P. The fourth portion 604 may correspond to the aforementioned aperture portion 580 of the light shielding unit 315. The fourth portion 604 may have a light transmittance different from the light transmittance of the third portion 603, the first portion 601, and the second portion 602.

The fifth portion 605 may correspond to the first groove 551. That is, the fifth portion 605 may define the position of the first groove 551. The fifth portion 605 may be disposed between the first portion 601 and the third portion 603. In other words, the fifth portion 605 may be disposed in a boundary area between the first portion 601 and the third portion 603. In this case, the fifth portion 605 may have a loop shape surrounding a peripheral portion of the first portion 601. The fifth portion 605 may have a light transmittance substantially the same as that of the fourth portion 604.

The sixth portion 606 may correspond to the second groove 552. That is, the sixth portion 606 may define the position of the second groove 552. The sixth portion 606 may be disposed between the second portion 602 and the third portion 603. In other words, the sixth portion 606 may be disposed in a boundary area between the second portion 602 and the third portion 603. In this case, the sixth portion 606 may have a loop shape surrounding a peripheral portion of the second portion 602. The sixth portion 606 may have a light transmittance substantially the same as that of the fourth portion 604.

The fifth portion 605 may have a width different from that of the sixth portion 606. For example, the fifth portion 605 may have a width in a range of about 2 μm to about 3 μm, and the sixth portion 606 may have a width in a range of about 0.5 μm to about 1.5 μm.

The light shielding unit 315 may be formed of the aforementioned material including the negative-type photoresist, or may be formed of the aforementioned material including the positive-type photoresist.

When the light shielding unit 315 is formed of the material including the negative-type photoresist, the light transmittance of the first through sixth portions 601, 602, 603, 604, 605, and 606 of the aforementioned mask M may have a comparative relationship defined by the following Mathematical Formula 3.

$$T1=T2>T3>T4=T5=T6 \qquad \text{<Mathematical Formula 3>}$$

In the above Mathematical Formula 3, T1, T2, T3, T4, T5 and T6 denote the light transmittance of the first portion 601, the light transmittance of the second portion 602, the light transmittance of the third portion 603, the light transmittance of the fourth portion 604, the light transmittance of the fifth portion 605, and the light transmittance of the sixth portion 606, respectively.

For example, the first portion 601 and the second portion 602 may each have a light transmittance of about 100%; the third portion 603 may have a light transmittance of about 55%, and the fourth portion 604, the fifth portion 605, and the sixth portion 606 may each have a light transmittance of about 0%.

The first portion 601 and the second portion 602 may have the greatest light transmittance of those of the first through sixth portions 601, 602, 603, 604, 605, and 606. The light transmittance of the first portion 601 and the second portion 602 may be substantially 100%. Accordingly, the first column spacer 501 disposed corresponding to the first portion 601 and the second column spacer 502 disposed corresponding to the second portion 602 may have a relatively great height.

The first portion 601 may have a dimension equal to that of the second portion 602, but alternatively, they may have different dimensions. As illustrated in FIGS. 14 and 15, the first portion 601 may have a dimension greater than that of the second portion 602.

The height of the first column spacer 501 may vary depending on the size of the first groove 551, and the size of the first groove 551 may vary depending on the dimension of the fifth portion 605. Accordingly, the height of the first column spacer 501 may vary in accordance with the width Wm1 of the fifth portion 605. In this case, as the width Wm1 of the fifth portion 605 increases, the height of the first column spacer 501 may increase.

The height of the second column spacer 502 may vary depending on the size of the second groove 552, and the size of the second groove 552 may vary depending on the dimension of the sixth portion 606. Accordingly, the height of the second column spacer 502 may vary in accordance with the width Wm2 of the sixth portion 606. In this case, as the width Wm2 of the sixth portion 606 increases, the height of the second column spacer 502 may increase.

As illustrated in FIGS. 14 and 15, as the fifth portion 605 has a width greater than that of the sixth portion 606, the first column spacer 501 may have a height greater than that of the second column spacer 502.

The third portion 603 may have the second greatest light transmittance of those of the first through sixth portions 601, 602, 603, 604, 605, and 606. Accordingly, the light shielding layer 500 disposed corresponding to the third portion 603 may have a height less than that of the second column spacer 502.

The fourth portion 604 may have the least height of those of the first through sixth portions 601, 602, 603, 604, 605, and 606. The light transmittance of the fourth portion 604 may be substantially 0%. Accordingly, the aperture portion 580 may be defined in the fourth portion 604.

On the other hand, when the light shielding unit 315 is formed of a material including the positive-type photoresist, the light transmittance of the first through sixth portions 601, 602, 603, 604, 605, and 606 of the aforementioned mask M may have a comparative relationship defined by the following Mathematical Formula 4.

$$T1=T2<T3<T4=T5=T6 \qquad \text{<Mathematical Formula 4>}$$

In the above Mathematical Formula 4, T1, T2, T3, T4, T5, and T6 denote the light transmittance of the first portion 601, the light transmittance of the second portion 602, the light transmittance of the third portion 603, the light transmittance of the fourth portion 604, the light transmittance of the fifth portion 605, and the light transmittance of the sixth portion 606, respectively.

Figure 16:
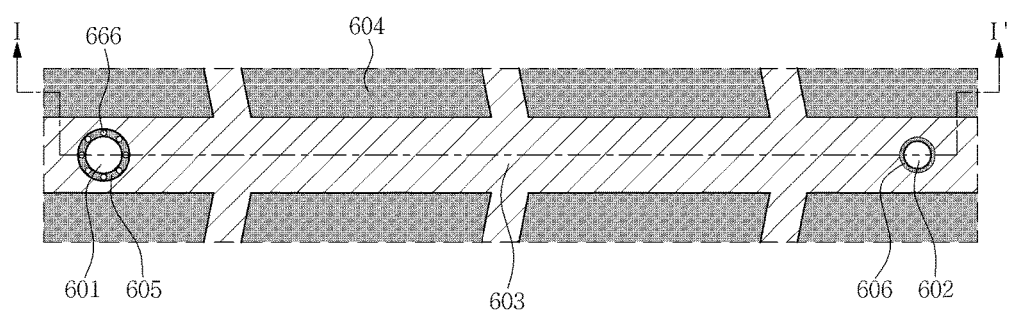
FIG. 16 is a plan view illustrating a portion of another mask used to form the light shielding unit illustrated in FIGS. 8 and 9.
Figure 17:
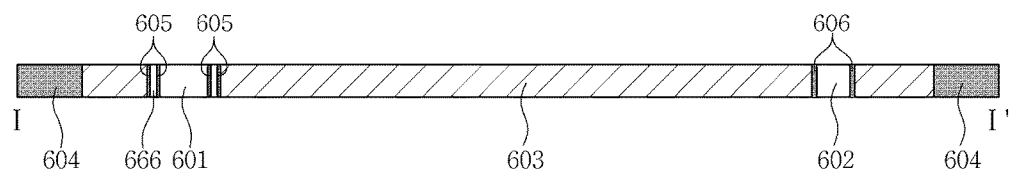
FIG. 17 is a cross-sectional view taken along line IT of FIG. 16.

FIG. 16 is a plan view illustrating a portion of another mask M used to form the light shielding unit 315 illustrated in FIGS. 8 and 9; and FIG. 17 is a cross-sectional view taken along line I-I' of FIG. 16.

The mask M, as illustrated in FIGS. 16 and 17, may include a first portion 601, a second portion 602, a third portion 603, a fourth portion 604, a fifth portion 605, a sixth portion 606, and a light transmission control pattern 666.

Since the first through sixth portions 601, 602, 603, 604, 605, and 606 of the mask M illustrated in FIGS. 16 and 17 are identical to those of the mask M illustrated in FIGS. 14 and 15, the related description pertaining thereto will make reference those of FIGS. 14 and 15.

The light transmission control pattern 666 may be formed in the fifth portion 605. The light transmission control pattern 666 may have a light transmittance substantially the same as that of the first portion 601. Two or more light transmission control patterns 666 may be formed in the fifth portion 605.

Figure 18:
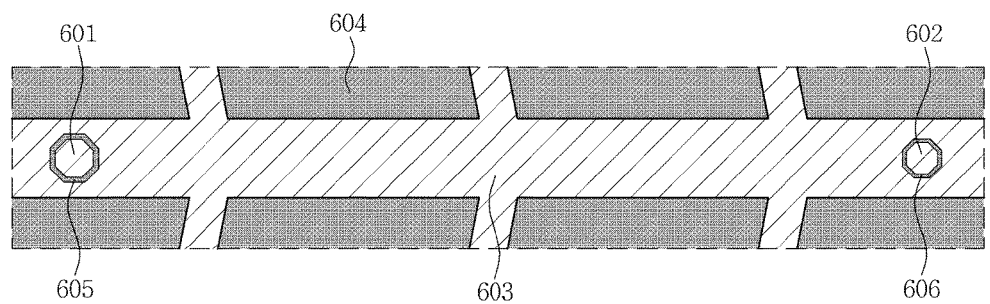
FIG. 18 is a plan view illustrating another configuration of the mask.

FIG. 18 is a plan view illustrating another configuration of the mask M.

A mask M, as illustrated in FIG. 18, may include a first portion 601 and a second portion 602, each having a polygonal shape.

Figure 19:
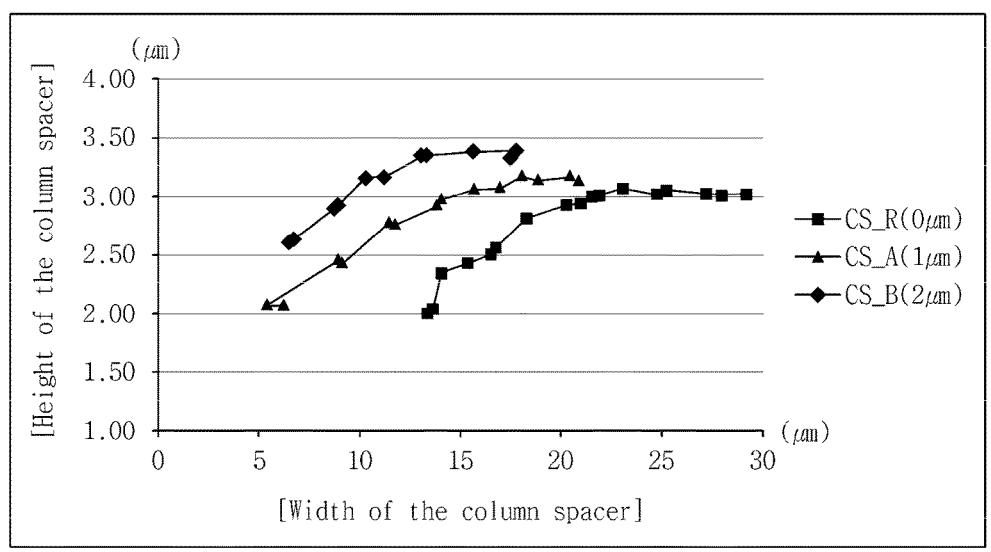
FIG. 19 is a graph illustrating a relationship between a height of a column spacer and a width of a fifth portion or a sixth portion.

FIG. 19 is a graph illustrating a relationship between the height of the column spacer and the width of the fifth portion 605 or the sixth portion 606.

In FIG. 19, X-axis represents a width of the column spacer, and Y-axis represents a height of the column spacer.

Among a reference column spacer CS-R, a main column spacer CS_A, and a sub-column spacer CS_B; the reference column spacer CS-R, which is formed using a mask M that has the fifth portion 605 having a width of about 0 μm, may have the least height of all; and the main column spacer CS_A, which is formed using a mask M that has the fifth portion 605 having a width of about 2 μm, may have the greatest height of all. Further, the sub-column spacer CS_B, which is formed by a mask M that has the fifth portion 605 having a width of about 1 μm, may have a height greater than that of the reference column spacer CS-R and less than that of the main column spacer CS_A.

As suggested in FIG. 19, although the column spacers have the same width, the height of the column spacers may vary depending on the width of the fifth portion 605.

Meanwhile, the configuration of the light shielding unit 315 according to the present inventive concept may be also applicable to an organic light emitting diode ("OLED") display device. That is, the OLED display device may include a pixel defining layer configured to define a pixel region P, and the pixel defining layer may include a light shielding layer 500, a first column spacer 501, a second column spacer 502, a first groove 551, and a second groove 552.

From the foregoing, it will be appreciated that various embodiments in accordance with the present disclosure have been described herein for purposes of illustration, and that various modifications may be made without departing from the scope and spirit of the inventive concept. Accordingly, the various exemplary embodiments disclosed herein are not intended to be limiting of the true scope and spirit of the inventive concept. Various features of the above described and other exemplary embodiments can be mixed and matched in any manner, to produce further exemplary embodiments consistent with the inventive concept.

What is claimed is:

1. A mask of a display device for forming a light shielding unit, which includes a first column spacer, a second column spacer, a light shielding layer, and a first groove, the mask comprising:
    a first portion corresponding to the first column spacer;
    a second portion having substantially a same light transmittance as that of the first portion and corresponding to the second column spacer;
    a third portion corresponding to the light shielding layer;
    a fourth portion corresponding to a pixel region; and
    a fifth portion disposed between the first portion and the third portion to correspond to the first groove and having a light transmittance substantially the same as that of the fourth portion.

2. The mask of a display device of claim 1, wherein the fifth portion surrounds the first portion.

3. The mask of a display device of claim 1, wherein light transmittances of the first through fifth portions are defined as the following Mathematical Formula 1, $$T1=T2>T3>T4=T5 \qquad \text{<Mathematical Formula 1>}$$

wherein T1, T2, T3, T4 and T5 denote the light transmittance of the first portion, the light transmittance of the second portion, the light transmittance of the third portion, the light transmittance of the fourth portion, and the light transmittance of the fifth portion, respectively.

4. The mask of a display device of claim 1, wherein light transmittances of the first through fifth portions are defined as the following Mathematical Formula 2, $$T1=T2<T3<T4=T5 \qquad \text{<Mathematical Formula 2>}$$

wherein T1, T2, T3, T4 and T5 denote the light transmittance of the first portion, the light transmittance of the second portion, the light transmittance of the third portion, the light transmittance of the fourth portion, and the light transmittance of the fifth portion, respectively.

5. The mask of a display device of claim 1, further having a light transmission control pattern formed in the fifth portion.

6. The mask of a display device of claim 5, wherein the light transmission control pattern has a light transmittance substantially the same as that of the first portion.

7. The mask of a display device of claim 1, wherein the first portion has a dimension greater than that of the second portion.

8. The mask of a display device of claim 1, wherein at least one of the first portion and the second portion has one of a circular or polygonal shape.

9. The mask of a display device of claim 1, wherein the light shielding unit further has a second groove, and
    the mask further has a sixth portion disposed between the second portion and the third portion to correspond to the second groove and having a light transmittance substantially the same as that of the fourth portion.

10. The mask of a display device of claim 9, wherein the sixth portion has a dimension different from that of the fifth portion.

11. The mask of a display device of claim 10, wherein the sixth portion has a dimension less than that of the fifth portion.

12. The mask of a display device of claim 11, wherein the sixth portion has a width in a range of about 0.5 μm to about 1.5 μm, and
    the fifth portion has a width in a range of about 2 μm to about 3 μm.

13. The mask of a display device of claim 1, wherein the first portion and the second portion have the same light transmittance of about 0(%) or 100(%),
    the fourth portion and the fifth portion have the same light transmittance of about 0(%) or 100(%),
    the first portion has a different light transmittance from the fourth portion.

14. The mask of a display device of claim 1, wherein the third portion has a light transmittance of from about 45% to about 55%.

15. A display device comprising;
    a first substrate and a second substrate opposed to each other;
    a liquid crystal layer disposed between the first substrate and the second substrate;
    a gate line and a data line disposed on the first substrate;
    a transistor connected to the gate line and the data line;
    a pixel electrode connected to the transistor and disposed in a pixel region; and
    a light shielding unit configured to define the pixel region, wherein the light shielding unit comprises:
    a light shielding layer defining the pixel region;
    a first column spacer;
    a second column spacer having a height less than that of the first column spacer; and
    a first groove having a shape of a closed curve surrounding the first column spacer.

16. The display device of claim 15, wherein the light shielding unit further has a second groove surrounding the second column spacer.

17. The display device of claim 16, wherein the second groove has a width less than that of the first groove.

18. The display device of claim 16, wherein the second groove has a depth less than that of the first groove.

19. The display device of claim 15, wherein the light shielding unit is disposed on one of the first substrate and the second substrate.

20. The display device of claim 15, wherein the first groove completely surrounds the first column spacer.

* * * * *